(12) United States Patent
Xu et al.

(10) Patent No.: US 11,977,246 B2
(45) Date of Patent: *May 7, 2024

(54) MASK ORIENTATION

(71) Applicant: Applied Materials, Inc., Santa Clara, CA (US)

(72) Inventors: Yongan Xu, Santa Clara, CA (US); Rutger Meyer Timmerman Thijssen, Sunnyvale, CA (US); Jinrui Guo, Santa Clara, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/120,520

(22) Filed: Mar. 13, 2023

(65) Prior Publication Data
US 2023/0213693 A1 Jul. 6, 2023

Related U.S. Application Data

(63) Continuation of application No. 17/571,039, filed on Jan. 7, 2022, now Pat. No. 11,630,251, which is a
(Continued)

(51) Int. Cl.
*G02B 5/18* (2006.01)
*G03F 1/42* (2012.01)
(Continued)

(52) U.S. Cl.
CPC .............. *G02B 5/1857* (2013.01); *G03F 1/42* (2013.01); *G03F 7/201* (2013.01); *G03F 7/70775* (2013.01); *G03F 7/2002* (2013.01)

(58) Field of Classification Search
CPC .......... G03F 7/70775; G03F 1/00; G03F 1/42; G03F 7/2002; G03F 7/201; G03F 9/70; G02B 5/1857
See application file for complete search history.

(56) References Cited

U.S. PATENT DOCUMENTS 10,942,430 B2 * 3/2021 Waldern ............ G02B 27/0172
2004/0029022 A1 2/2004 Farar
(Continued)

FOREIGN PATENT DOCUMENTS

| JP | S57198460 A | 12/1982 |
| JP | H08-122551 A | 5/1996 |
| KR | 20150112581 A | 10/2015 |

OTHER PUBLICATIONS

International Search Report & Written Opinion dated Apr. 5, 2021 for PCT/US2020/063782.
(Continued)

*Primary Examiner* — Deoram Persaud
(74) *Attorney, Agent, or Firm* — Patterson + Sheridan, LLP

(57) ABSTRACT

A method of forming patterned features on a substrate is provided. The method includes positioning a plurality of masks arranged in a mask layout over a substrate. The substrate is positioned in a first plane and the plurality of masks are positioned in a second plane, the plurality of masks in the mask layout have edges that each extend parallel to the first plane and parallel or perpendicular to an alignment feature on the substrate, the substrate includes a plurality of areas configured to be patterned by energy directed through the masks arranged in the mask layout. The method further includes directing energy towards the plurality of areas through the plurality of masks arranged in the mask layout over the substrate to form a plurality of patterned features in each of the plurality of areas.

20 Claims, 3 Drawing Sheets

Related U.S. Application Data continuation of application No. 16/735,603, filed on Jan. 6, 2020, now Pat. No. 11,226,440.

(51) Int. Cl.
*G03F 7/00* (2006.01)
*G03F 7/20* (2006.01)

(56) References Cited

U.S. PATENT DOCUMENTS

| | | | |
|---|---|---|---|
| 2005/0134820 A1* | 6/2005 | Mulder | G03F 7/701 355/77 |
| 2007/0128524 A1 | 6/2007 | Liang et al. | |
| 2010/0035431 A1 | 2/2010 | Wurm et al. | |
| 2012/0026478 A1 | 2/2012 | Chen et al. | |
| 2012/0033306 A1* | 2/2012 | Valera | G02B 27/4205 385/37 |
| 2013/0100431 A1* | 4/2013 | Kajiyama | G02F 1/13 355/72 |
| 2014/0178803 A1* | 6/2014 | Yoo | G03F 7/70466 430/312 |
| 2016/0231568 A1 | 8/2016 | Saarikko et al. | |
| 2019/0121027 A1* | 4/2019 | Popovich | G02B 27/283 |
| 2019/0164899 A1 | 5/2019 | Hu et al. | |
| 2020/0264378 A1* | 8/2020 | Grant | G02B 6/0016 |

OTHER PUBLICATIONS

Office Action, dated Sep. 5, 2023, for Japanese Patent Application No. 2022-540834.

European Search Report, dated Jan. 8, 2024, for European Patent Application No. 20912099.7.

* cited by examiner

MASK ORIENTATION

CROSS-REFERENCE TO RELATED APPLICATION(S)

This application is a continuation application of co-pending U.S. patent application Ser. No. 17/571,039, filed Jan. 7, 2022, which is a continuation of U.S. patent application Ser. No. 16/735,603 filed Jan. 6, 2020, the entire contents of which are each hereby incorporated herein by reference.

BACKGROUND

Field

Embodiments of the present disclosure generally relate to methods of forming patterns in substrates, for example using masks to transfer patterns to substrates.

Description of the Related Art

Transferring patterns to substrates, such as semiconductor substrates, is often accomplished using masks. For example, photolithography can be used to transfer patterns in the masks to a photoresist disposed on the substrate. Because the patterns to be formed on the substrate correspond to the patterns on the mask, the complexity of the patterns to be formed on the substrate directly effect the complexity and thus costs of forming the corresponding masks. Furthermore, increases in the complexity of a mask (e.g., number of features) can cause reductions in throughput when a substrate is being processed with a more complex mask compared to a process being processed with a less complex mask.

Therefore, there is a need for methods and corresponding equipment which can reduce mask complexity and increase throughput for substrate processing.

SUMMARY

Embodiments of the present disclosure generally relate to methods of forming patterns in substrates, for example using masks to transfer patterns to substrates. In one embodiment, a method of forming patterned features on a substrate is provided. The method includes positioning a plurality of masks arranged in a mask layout over a substrate, wherein the substrate is positioned in a first plane and the plurality of masks are positioned in a second plane, the plurality of masks in the mask layout have edges that each extend parallel to the first plane and parallel or perpendicular to an alignment feature on the substrate, the substrate includes a plurality of areas configured to be patterned by energy directed through the masks arranged in the mask layout, the plurality of areas configured to be patterned are spaced apart from each other by one or more areas not configured to be patterned by the energy directed through the masks, and each area of the plurality of areas configured to be patterned is spaced apart from a closest area of the plurality of areas configured to be patterned by a shortest distance along a direction offset by at least 5 degrees from directions in the first plane that extend parallel or perpendicular to the alignment feature on the substrate. The method further includes directing energy towards the plurality of areas through the plurality of masks arranged in the mask layout over the substrate to form a plurality of patterned features in each of the plurality of areas, wherein a number of the formed plurality of patterned features extending along directions in the first plane that are within ±2.5 degrees of being parallel or perpendicular to the alignment feature are greater than a number of the formed plurality of patterned features extending along directions in the first plane that do not align within ±2.5 degrees of being parallel or perpendicular to the alignment feature.

In another embodiment, a method of forming patterned features on a substrate is provided. The method includes positioning a plurality of masks arranged in a mask layout over a substrate that is positioned, wherein the substrate is positioned in a first plane and the plurality of masks are positioned in a second plane, the plurality of masks in the mask layout have edges that each extend parallel to the first plane and parallel or perpendicular to an alignment feature on the substrate, the substrate includes a plurality of areas configured to be patterned by energy directed through the masks arranged in the mask layout, the plurality of areas configured to be patterned are spaced apart from each other by one or more areas not configured to be patterned by the energy directed through the masks, and each area of the plurality of areas configured to be patterned is spaced apart from a closest area of the plurality of areas configured to be patterned by a shortest distance along a direction offset by at least 5 degrees from directions in the first plane that extend parallel, perpendicular, ±30 degrees, ±45 degrees, or ±60 degrees relative to the alignment feature on the substrate. The method further includes directing energy towards the plurality of areas through the plurality of masks arranged in the mask layout over the substrate to form a plurality of patterned features in each of the plurality of areas, wherein a number of the formed plurality of patterned features extending along directions in the first plane that are within ±2.5 degrees of being parallel, perpendicular, ±30 degrees, ±45 degrees, or ±60 degrees relative to the alignment feature are greater than a number of the formed plurality of patterned features extending along directions in the first plane that do not align within ±2.5 degrees of being parallel, perpendicular, ±30 degrees, ±45 degrees, or ±60 degrees relative to the alignment feature.

In another embodiment, a method of forming gratings on a substrate is provided. The method includes positioning a plurality of masks arranged in a mask layout over a substrate that is positioned, wherein the substrate is positioned in a first plane and the plurality of masks are positioned in a second plane, the plurality of masks in the mask layout have edges that each extend parallel to the first plane and parallel or perpendicular to an alignment feature on the substrate, the substrate includes a plurality of areas configured to be patterned by energy directed through the masks arranged in the mask layout, the plurality of areas configured to be patterned are spaced apart from each other by one or more areas not configured to be patterned by the energy directed through the masks, and each area of the plurality of areas configured to be patterned is spaced apart from a closest area of the plurality of areas configured to be patterned by a shortest distance along a direction offset by at least 5 degrees from directions in the first plane that extend parallel or perpendicular to the alignment feature on the substrate. The method further includes directing energy towards the plurality of areas through the plurality of masks arranged in the mask layout over the substrate to form a plurality of gratings in each of the plurality of areas, wherein a number of the formed plurality of gratings extending along directions in the first plane that are within ±2.5 degrees of being parallel or perpendicular to the alignment feature are greater than a number of the formed plurality of gratings extending along directions in the first plane that do not align within ±2.5 degrees of being parallel or perpendicular to the alignment feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1A:
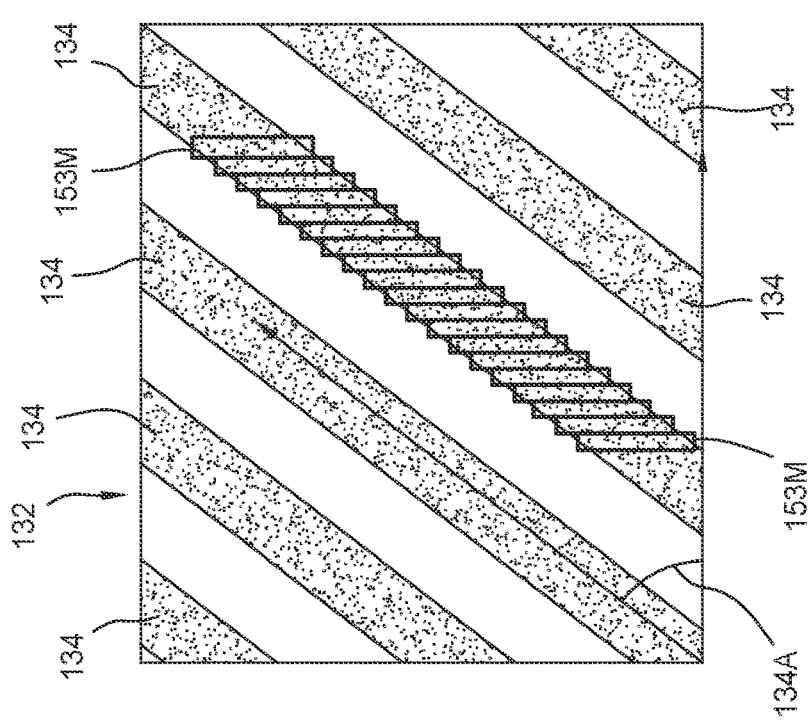
FIG. 1A is a top view of three masks arranged over a substrate, according to a conventional patterning process.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments of the present disclosure generally relate to methods of forming patterns in substrates, for example using masks to transfer patterns to substrates. Although the following is described in reference to improving methods for forming a waveguide combiner, the improvements from these methods are also applicable to numerous other methods which use masks or reticles to create patterns including but not limited to lithography, such as optical lithography or ultraviolet lithography (e.g., extreme UV lithography) as well as lithography using other portions of the electromagnetic spectrum, such as infrared or X-ray.

FIG. 1A is a top view of three masks 151-153 arranged over a substrate 100, according to a conventional patterning process. The substrate 100 includes a waveguide combiner 101. The waveguide combiner 101 can be used in an augmented reality device (not shown). The waveguide combiner 101 includes an input coupling region 110, an intermediate coupling region 120, and an output coupling region 130. The intermediate coupling region 120 can also be referred to as an exit pupil expansion region. Although not shown, in some embodiments, the functions of the intermediate coupling region 120 and the output coupling region 130 can be designed and located in a same region. The coupling regions 110, 120, 130 are used to couple light through the waveguide combiner 101, so that images can be displayed to the user of the augmented reality device. The coupling regions 110, 120, 130 include pattern features to couple light through the waveguide combiner 101. The patterned features include but are not limited to pillars (e.g., circular pillars and elongated pillars) and gratings (e.g., line/space gratings). These patterned features can be oriented at a variety of angles relative to a reference line in the plane of the substrate on which the patterned features are to be formed. For example, if a substrate is considered to be positioned in an XY plane with a thickness of the substrate extending in the Z-direction, the patterned features can be oriented along any angle from 0 degrees to 90 degrees relative to a reference line in the XY plane. Furthermore, some embodiments may include multiple patterned features oriented along angles different from each other with no particular relationship determining the difference between these angles. The size of the patterned features can also vary. In some embodiments, the size of the patterned features can vary according to the critical dimension of the device being formed, for example from about 10 nm to about 5 um. The gratings include slanted features arranged in patterns across the coupling regions 110, 120, 130.

The input coupling region 110 is configured to receive incoming light and transmit light to the intermediate coupling region 120. The input coupling region 110 includes an input patterned area 112 including a first plurality of patterned features 114. In some embodiments, the plurality of patterned features 114 can include a plurality of gratings. The plurality of patterned features 114 can be arranged across the input patterned area 112 to extend in a direction defined by an input coupling region angle 114A. In some embodiments, the input coupling region 110 can include additional patterned features (not shown) outside of the input patterned area 112. These additional patterned features can be aligned along one or more angles that are different from the input coupling region angle 114A.

The intermediate coupling region 120 is configured to receive light from the input coupling region 110 and transmit light to the output coupling region 130. The intermediate coupling region 120 includes an intermediate patterned area 122 including a plurality of patterned features 124. In some embodiments, the plurality of patterned features 124 can include a plurality of gratings. The plurality of patterned features 124 can be arranged across the intermediate patterned area 122 to extend in a direction defined by an intermediate coupling region angle 124A. In some embodiments, the intermediate coupling region 120 can include additional patterned features (not shown) outside of the intermediate patterned area 122. These additional patterned features can be aligned along one or more angles that are different from the intermediate coupling region angle 124A.

The output coupling region 130 is configured to receive light from the intermediate coupling region 120 and output images from the output coupling region 130. The output coupling region 130 includes an output patterned area 132 including a plurality of patterned features 134. In some embodiments, the plurality of patterned features 134 can include a plurality of gratings. The plurality of patterned features 134 can be arranged across the output patterned area 132 to extend in a direction defined by an output coupling region angle 134A. In some embodiments, the output coupling region 130 can include additional patterned features (not shown) outside of the output patterned area 132. These additional patterned features can be aligned along one or more angles that are different from the output coupling region angle 134A.

Three masks 151-153 can be positioned over the waveguide combiner 101. A first mask 151 can be positioned over the input coupling region 110 and a first portion 1201 of the intermediate coupling region 120. A second mask 152 can be positioned over a second portion 1202 of the intermediate coupling region 120. A third mask 153 can be positioned over the output coupling region 130.

The waveguide combiner 101 is positioned in a first orientation relative to a notch 105 in the substrate 100. The notch 105 in the substrate 100 can be used to position the substrate 100 in a first position in which the notch is aligned with the Y-axis. In the first orientation, the input coupling region 110 is spaced apart from the intermediate coupling region 120 in the Y-direction. Furthermore, the output coupling region 130 is spaced apart from the intermediate coupling region 120 in the X-direction in the first orientation. In some embodiments, the X and Y axis can correspond to axes on equipment used to form the patterned features on the waveguide combiner, such as lithography equipment. The patterns in the masks 151-153 are formed to correspond to the patterned features 114, 124, 134 on the respective coupling regions 110, 120, 130 when the masks 151-153 are positioned over the coupling regions 110, 120, 130 when the substrate 100 is in the first position. Furthermore, the masks 151-153 can also include patterns to form the additional patterned features (not shown) mentioned above that can be located in the coupling regions 110, 120, 130.

Figure 1B:
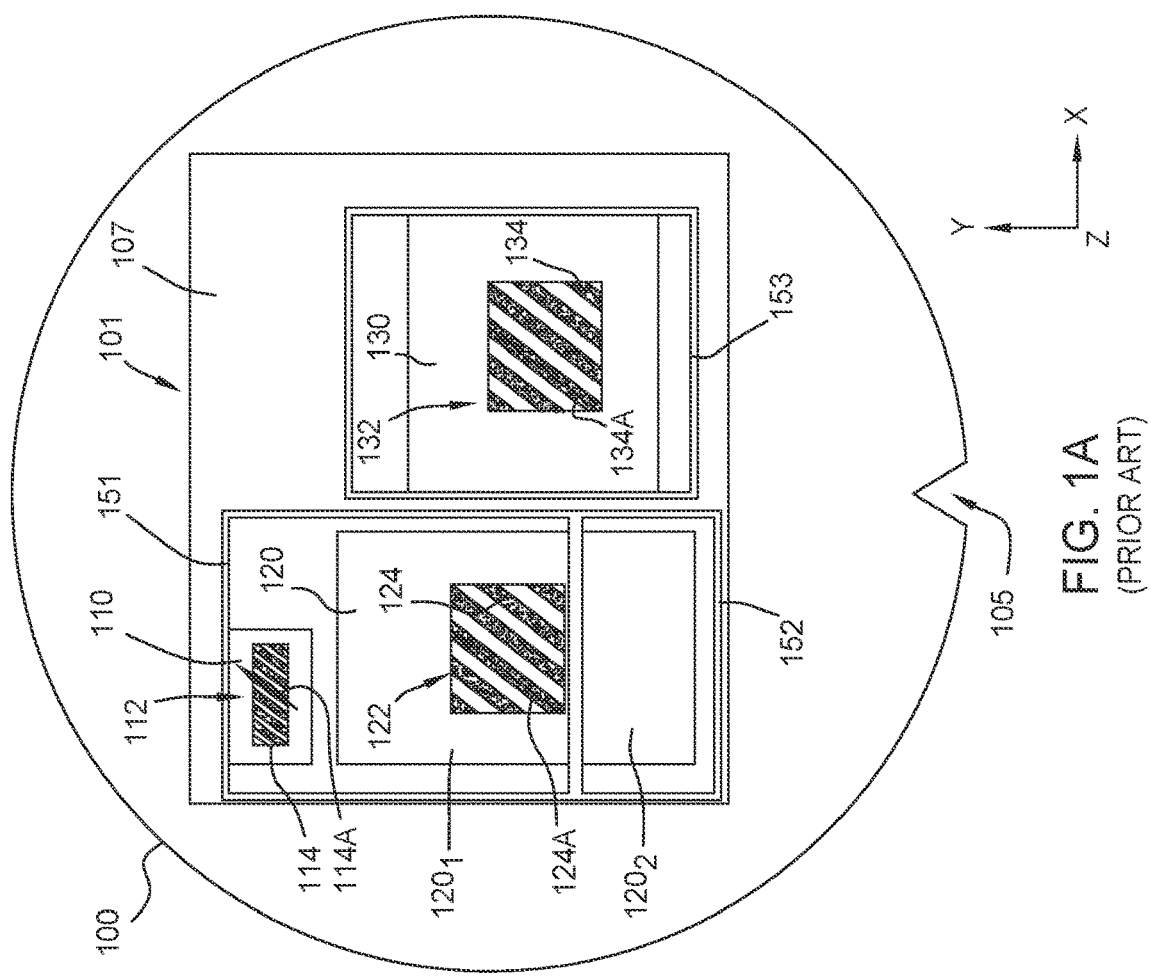
FIG. 1B shows an enlarged view of output patterned area of the output coupling region from FIG. 1A.

FIG. 1B shows an enlarged view of output patterned area 132 of the output coupling region 130 from FIG. 1A. FIG. 1B further shows exemplary electron beam exposure shots 153M that can be used to fabricate the patterns in the third mask 153 that correspond to the patterned features 134 in the output patterned area 132. The patterned features 134 are aligned along the output coupling region angle 134A. The output coupling region angle 134A is about 37 degrees relative to the Y-axis (i.e., the direction in which the notch 105 points). Equipment used to fabricate masks can operate efficiently along standard angles (e.g., 0 degrees, ±45 degrees, and 90 degrees) as well as relatively standard angles (e.g., ±30 degrees and ±60 degrees). For example, equipment used to fabricate masks can generally use a lower number of larger electron beam exposure shots to form patterns in masks within about ±2.5 degrees of these standard angles and relatively standard angles. Conversely, this same equipment cannot produce patterns in masks with the same efficiency along non-standard angles (i.e., angles at least ±2.5 degrees offset from the standard and relatively standard angles mentioned above). Thus, a higher number of smaller electron beam exposure shots are needed to generate patterns along these non-standard angles.

Because the patterned features 134 are aligned along a non-standard angle of 37 degrees, a higher number of smaller electron beam exposure shots are needed to achieve an acceptable pattern in the third mask 153 that can then be used to form the patterned features 134 within design specifications (e.g., acceptable line edge roughness of the patterned features 134). When an attempt is made to use a lower number of larger electron beam exposure shots to form patterns in masks along non-standard angles (e.g., 37 degrees), a staircase effect occurs in the newly fabricated mask. This staircase effect in the newly fabricated mask then leads to a corresponding staircase effect in the patterns on the devices formed with the newly fabricated mask. Thus, the higher number of smaller electron beam shots are needed to fabricate the masks with patterns aligned along the non-standard angles, such as 37 degrees. This higher number of smaller electron beam shots can significantly lower throughput for fabricating masks resulting in increased costs. Thus, a solution is needed to avoid the problems associated with forming patterns in masks along the non-standard angles mentioned above.

Figure 2A:
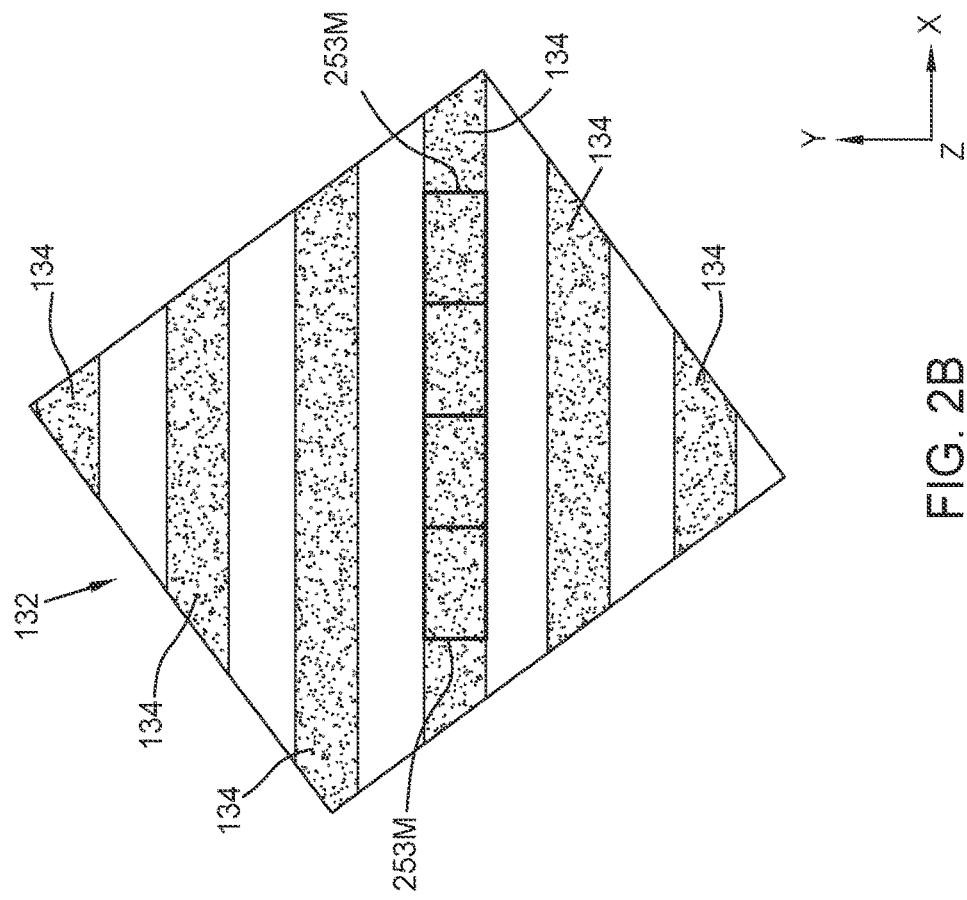
FIG. 2A is a top view of four masks arranged over a substrate, according to one embodiment.

FIG. 2A is a top view of four masks 251-254 arranged over a substrate 200, according to one embodiment. The substrate 200 includes the waveguide combiner 101 described above in reference to FIG. 1A. The substrate 200 is similar to the substrate 100 (FIG. 1A) except that the waveguide combiner 101 is positioned in a second orientation relative to the notch 105 when compared to the first orientation of the waveguide combiner 101 relative to the notch 105 as shown in FIG. 1A. In this second orientation, the patterned features 114, 124, 134 of the coupling regions 110, 120, 130 are substantially aligned with the X-axis. Used herein, substantially aligned with an axis or angle refers to a feature being aligned within about ±2.5 degrees of the axis or angle.

Positioning the waveguide combiner 101 on the substrate 200 in this second orientation causes the patterned areas 112, 122, 132 to be spaced apart from each other in directions that are substantially offset from the X-axis or the Y-axis. Used herein, a direction that is substantially offset from an axis refers to a direction that extends at angle at least 5 degrees offset from that axis. For example, on the substrate 200, the input patterned area 112 of the input coupling region 110 is spaced apart from intermediate patterned area 122 of the intermediate coupling region 120 by a portion of an unpatterned area 107 in a first direction D1 in the XY plane that is at least 5 degrees offset from the X-axis and at least 5 degrees offset from the Y-axis. The first direction D1 can the direction along which there is a shortest distance between the input coupling region 110 and the intermediate coupling region 120. Similarly, the intermediate patterned area 122 of the intermediate coupling device 120 is spaced apart from the output patterned area 132 of the output coupling region 130 by another portion of the unpatterned area 107 in a second direction D2 in the XY plane that is at least 5 degrees offset from the X-axis and at least 5 degrees offset from the Y-axis. The second direction D2 can be the direction along which there is a shortest distance between the intermediate coupling region 120 and the output coupling region 130. In some embodiments, the first direction D1 can be perpendicular to the second direction D2.

The four masks 251-254 can be positioned over the waveguide combiner 101 of the substrate 200. A first mask 251 can be positioned over the input coupling region 110 and a first portion 1201 of the intermediate coupling region 120. A second mask 252 can be positioned over a second portion 1202 of the intermediate coupling region 120. A third mask 253 can be positioned over a third portion 1203 of the intermediate coupling region 120 and a first portion 1301 of the output coupling region 130. A fourth mask 254 can be positioned over a second portion 1302 of the output coupling region 130. In some embodiments, each mask 251-254 can include an edge aligned with the Y-axis (e.g., edge 252E1) and an edge aligned with the X-axis (e.g., edge 252E2). Furthermore, in some embodiments, each edge of one or more of the masks 251-254, such as all of the masks 251-254, is aligned with the either the Y-axis or the X-axis.

Figure 2B:
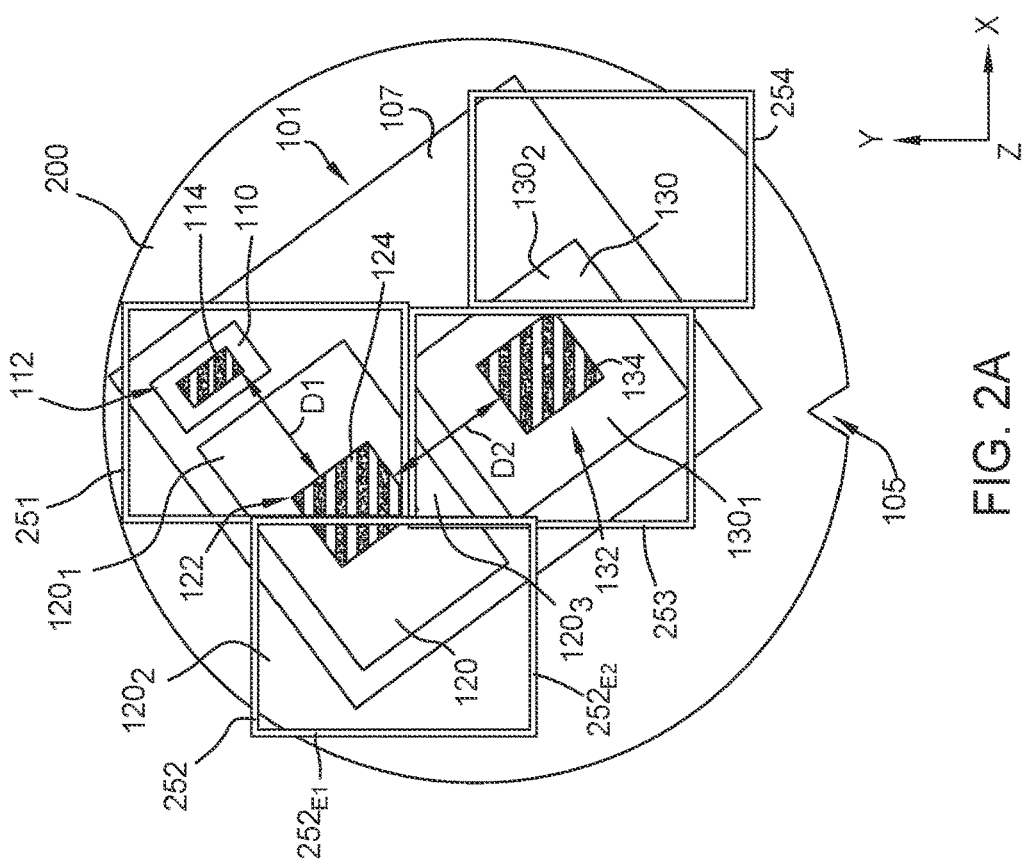
FIG. 2B shows an enlarged view of the output patterned area of the output coupling region of the substrate from FIG. 2A.

FIG. 2B shows an enlarged view of the output patterned area 132 of the output coupling region 130 of the substrate 200 from FIG. 2A. FIG. 2B further shows exemplary electron beam exposure shots 253M that can be used to fabricate the patterns in the third mask 253 that correspond to the patterned features 134. The patterned features 134 are substantially aligned with the X-axis. When patterned features are substantially aligned along standard angles (e.g., 0 degrees, ±45 degrees, and 90 degrees) and relatively standard angles (e.g., ±30 degrees and ±60 degrees) a lower number of larger electron beam exposure shots can be used to form patterns in masks. For example, exemplary electron beam exposure shots 253M of FIG. 2B aligned along the standard angle of 90 degrees relative to Y-axis and the direction in which the notch 105 points. Thus, the electron beam shots 253M of FIG. 2B are substantially larger than the exemplary electron beam exposure shots 153M of FIG. 1B, which are aligned along the non-standard angle of 37 degrees. Moreover, the substantially larger electron beam shots 253M allow substantially less electron beam shots to be used to form the patterns in the mask 253 relative to the patterns in the mask 153, which can result in significant reductions in cost. This cost reduction allowed by forming patterns in masks along standard and relatively standard angles can be a cost reduction by a factor of 10 or more compared to forming patterns in masks along non-standard angles (e.g., 37 degrees).

Because the cost reduction of forming patterns in masks along standard and relatively standard angles is so high (e.g., a factor of ten), significant cost savings can still be achieved even when more masks are used. For example, even though FIG. 2A shows a layout of four masks 251-254 being used and FIG. 1A shows a layout of three masks 151-153 being used, the layout of the four masks 251-254 still results in a significant cost savings relative to the layout of the three masks 153 because the masks 151-153 shown in FIG. 1A can each cost significantly more (ten times as much) than the masks 251-254 shown in FIG. 2A.

Figure 3:
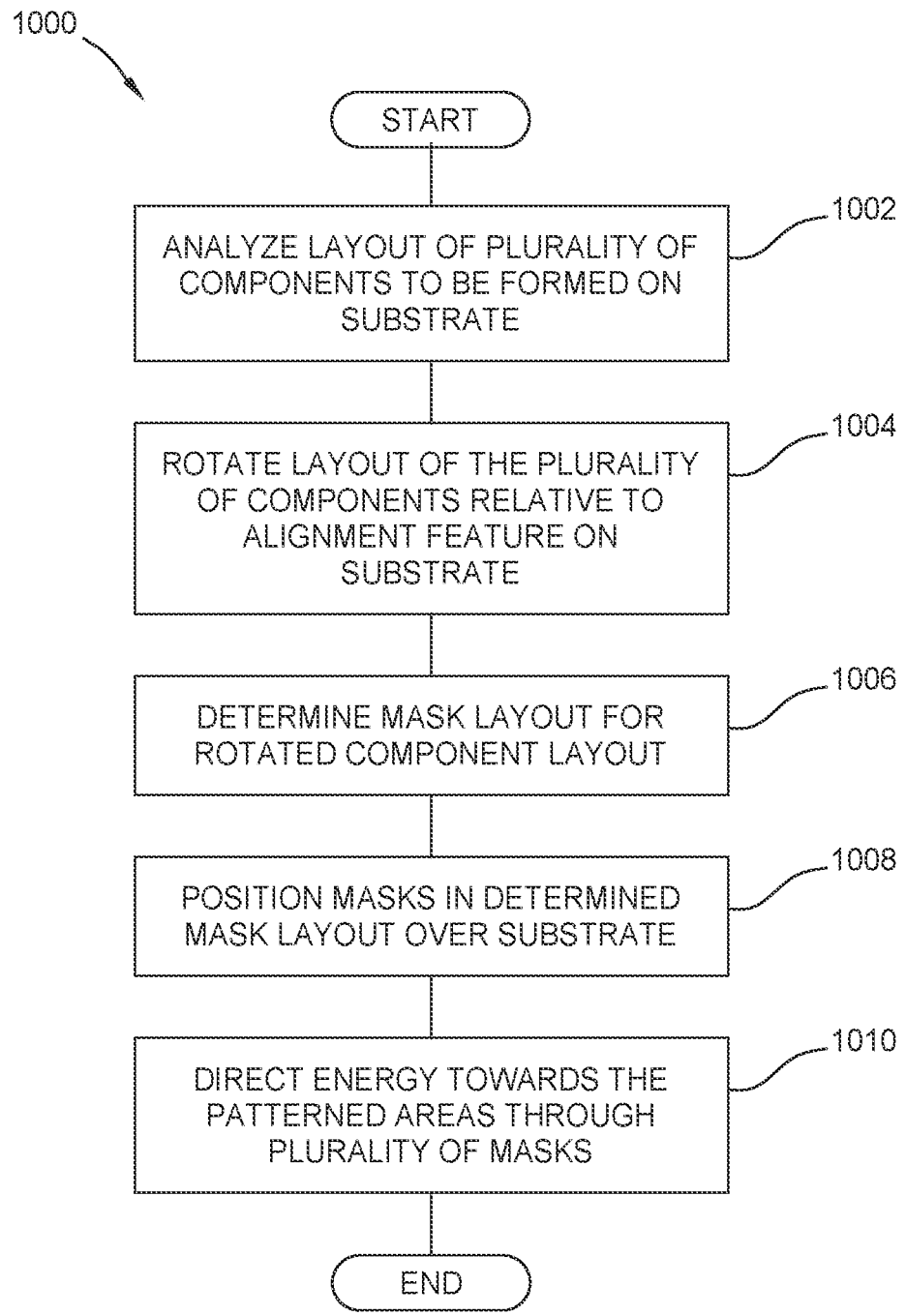
FIG. 3 is a process flow diagram of a method for forming the patterned features of the respective patterned areas shown in FIG. 2A, according to one embodiment.

FIG. 3 is a process flow diagram of a method 1000 for forming the patterned features 114, 124, 134 of the respective patterned areas 112, 122, 132 shown in FIG. 2A, according to one embodiment. The method 1000 is described in reference to FIGS. 1A, 1B, 2A, 2B, and 3.

The method 1000 begins at block 1002, by analyzing an initial layout of a plurality of components to be formed on a substrate relative to an alignment feature on the substrate (e.g., notch 105). Each of the plurality of components in the layout can include a plurality of patterned features with each of the plurality of components being spaced apart from each other by one or more unpatterned areas 107 as described above.

For example, referring to FIG. 1A, the orientation of the patterned features 114, 124, 134 (plurality of patterned features) of the coupling regions 110, 120, 130 (plurality of components) can be analyzed to determine the angle at which these patterned features 114, 124, 134 extend in the XY plane relative to the direction in which the notch 105 points in the XY plane. Furthermore, the coupling regions 110, 120, 130 (plurality of components) are spaced apart from each other by one or more unpatterned areas 107. The coupling regions 110, 120, 130 are also spaced apart from each other along directions D1, D2 (see FIG. 2A) in the XY plane which are parallel (Y-direction) and perpendicular (X-direction) to the direction in which the notch 105 points (Y-direction) in the XY plane.

The analysis can determine whether more patterned features in the coupling regions 110, 120, 130 (plurality of components) align in the XY plane within about ±2.5 degrees of one or more standard angles (e.g., 0 degrees, ±45 degrees, and 90 degrees) and/or one or more relatively standard angles (e.g., ±30 degrees and ±60 degrees) relative to a direction in which the notch 105 points in the XY plane. For example, referring to FIG. 1A, the layout of the coupling regions 110, 120, 130 can be analyzed to determine that the patterned features 114, 124, 134 are oriented at about 37 degrees in the XY plane relative to the direction in which the notch 105 points in the XY plane, which is not within ±2.5 degrees of the one or more standard angles or relatively standard angles.

If the analysis at block 1002 determines that a number of patterned features in the coupling regions 110, 120, 130 (plurality of components) that align in the XY plane within about ±2.5 degrees of one or more standard angles (e.g., 0 degrees, ±45 degrees, and 90 degrees) and/or one or more relatively standard angles (e.g., ±30 degrees and ±60 degrees) in the XY plane relative to a direction in which the notch 105 points in the XY plane are greater than the number of patterned features which do not align according to those limits, then the method 1000 can end. On the other hand, as in the case shown in FIG. 1A, if the analysis at block 1002 determines that a number of patterned features in the coupling regions 110, 120, 130 (plurality of components) that do not align in the XY plane within about ±2.5 degrees of one or more standard angles (e.g., 0 degrees, ±45 degrees, and 90 degrees) and/or one or more relatively standard angles (e.g., ±30 degrees and ±60 degrees) in the XY plane relative to a direction in which the notch 105 points in the XY plane are greater than the number of patterned features which do align according to those limits, then the method 1000 continues at block 1004.

At block 1004, the layout of the coupling regions 110, 120, 130 (plurality of components) is rotated relative to the notch 105, so that more patterned features in the coupling regions 110, 120, 130 (plurality of components) align within about ±2.5 degrees of one or more standard angles (e.g., 0 degrees, ±45 degrees, and 90 degrees) and/or one or more relatively standard angles (e.g., ±30 degrees and ±60 degrees) relative to a direction in which the notch 105 points compared to a number of patterned features that do not align according to those limits. For example, FIG. 2A provides on example of how the layout of the coupling regions 110, 120, 130 (plurality of components) is rotated relative to the notch 105 and the layout of FIG. 1A. This rotation causes more patterned features in the coupling regions 110, 120, 130 (plurality of components) to align within about ±2.5 degrees of the standard angles and relatively standard angles (described above) relative to the direction in which the notch 105 points when compared to a number of patterned features which do not align according to those limits.

The rotation at block 1004 causes each coupling region 110, 120, 130 to spaced apart from a closest coupling region 110, 120, 130 by a shortest distance along a direction in the XY plane that is substantially offset (i.e., offset by 5 degrees or more) from directions parallel or perpendicular to the direction in which the notch 105 points in the XY plane. For example, as shown in FIG. 2A, the coupling regions 110, 120 are spaced apart from each other by a shortest distance along the direction D1 in the XY plane, which is substantially offset from directions parallel or perpendicular to the direction in which the notch 105 points (Y-direction) in the XY plane. Similarly, the coupling regions 120, 130 are spaced apart from each other by a shortest distance along the direction D2 in the XY plane, which is substantially offset from directions parallel or perpendicular to the direction in which the notch 105 points (Y-direction) in the XY plane.

At block 1006, a mask layout including a plurality of masks is determined for the component layout of the coupling regions 110, 120, 130 relative to the notch 105 determined at block 1004. The mask layout can be determined for rectangular masks having edges that extend parallel and perpendicular to the direction in which the notch points. For example, FIG. 2A shows a layout of rectangular masks 251-254 to be disposed over the component layout of the coupling regions 110, 120, 130 relative to the notch determined at block 1004. Furthermore, FIG. 2B shows that the edges (e.g., edges 252E1, 252E2) of the rectangular masks 251-254 extend parallel and perpendicular to the direction in which the notch 105 points. Although, the individual masks 251-254 are rectangular, the overall shape of the mask layout can be a non-rectangular shape, such as an L-shape or a T-shape. In some embodiments, such as the embodiment shown in FIG. 2B, the overall shape of the mask layout can be an irregular shape.

At block 1008, referring to FIG. 2A, the masks 251-254 are positioned in the mask layout determined at block 1006 over the substrate 200 positioned. The substrate 200 can be described as being positioned in a first XY plane while the masks 251-254 can be described as being positioned in a second XY plane. The first XY plane can be parallel to the second XY plane. The masks 251-254 can each have edges (e.g., edges 252E1, 252E2) that extend in the second XY plane parallel or perpendicular to the alignment feature (i.e., the notch 105) on the substrate 200.

At block 1010, referring to FIG. 2A, energy (e.g., visible light or UV energy) is directed through the masks 251-254 positioned in the mask layout over the substrate 200 as described at block 1008 to form the plurality of patterned features including the plurality of patterned features 114, 124, 134 in the patterned regions 110, 120, 130. At block 1010, a number of the formed plurality of patterned features extending along directions in the first XY plane that are within ±2.5 degrees of being parallel, perpendicular, ±30 degrees, ±45 degrees, or ±60 degrees relative to the alignment feature (e.g., notch 105) are greater than a number of the formed plurality of patterned features extending along directions in the first plane that do not align within ±2.5 degrees of being parallel, perpendicular, ±30 degrees, ±45 degrees, or ±60 degrees relative to the alignment feature. For example, FIG. 2A shows the plurality of patterned features 114, 124, 134 extend perpendicular to the direction in which the notch points. Furthermore, although the coupling regions 110, 120, 130 can include other patterned features (not shown) extending in other directions, the number of the plurality of patterned features 114, 124, 134 outnumber these other features.

Overall, while at first glance the mask layout shown in FIG. 2A appears somewhat staggered and random compared to the mask layout shown in FIG. 1A, the mask layout in FIG. 2A and related process described in method 1000 can significantly reduce the costs associated with producing patterned features on a substrate, such as forming gratings for a waveguide combiner. Furthermore, even though FIG. 2A shows four masks being used compared to only three masks being used in FIG. 1A, the cost of each mask shown in FIG. 2A can be significantly less, such as ten times less, than the cost of each mask shown in FIG. 1A, so that the overall cost of the four masks for FIG. 2A is significantly less than the cost of the masks shown in FIG. 1A. This reduction in capital costs for the embodiment shown in FIG. 2A ultimately reduces the costs of devices, such as waveguide combiners, generated through the use these masks.

While the foregoing is directed to embodiments of the present disclosure, other and further embodiments of the disclosure may be devised without departing from the basic scope thereof, and the scope thereof is determined by the claims that follow.

The invention claimed is:

1. A method of forming patterned features on a substrate comprising:
    positioning a plurality of masks over a substrate based on a mask layout, wherein
        the substrate is positioned in a first plane and the plurality of masks are positioned in a second plane when the plurality of masks are positioned according to the mask layout,
        the plurality of masks in the mask layout have edges that each extend parallel to the first plane, each mask having a first edge,
        the substrate includes a plurality of areas configured to be patterned by energy directed through the plurality of masks arranged in the mask layout,
        the plurality of areas configured to be patterned are spaced apart from each other by one or more areas not configured to be patterned by the energy directed through the plurality of masks, and
        each area of the plurality of areas configured to be patterned is spaced apart from a closest area of the plurality of areas configured to be patterned by a shortest distance along a direction offset by at least 5 degrees from directions in the first plane that extend parallel or perpendicular to the first edge of each mask of the plurality of masks in the second plane; and
    directing energy towards the plurality of areas through the plurality of masks when the plurality of masks are positioned over the substrate according to the mask layout, the directed energy forming a plurality of patterned features in each of the plurality of areas, wherein
        a number of the formed plurality of patterned features extending along directions in the first plane that are within ±2.5 degrees of being parallel or perpendicular to the first edge of each mask of the plurality of masks in the second plane are greater than a number of the formed plurality of patterned features extending along directions in the first plane that do not align within ±2.5 degrees of being parallel or perpendicular to the first edge of each mask of the plurality of masks in the second plane.

2. The method of claim 1, wherein the energy directed through the masks includes one or more of visible light or ultraviolet energy.

3. The method of claim 1, wherein two or more masks of the plurality of masks are simultaneously positioned over the substrate according to the mask layout.

4. The method of claim 1, wherein the plurality of masks includes three or more masks.

5. The method of claim 1, wherein each mask has a rectangular shape.

6. The method of claim 5, wherein an overall shaped formed by the plurality of masks in the mask layout is non-rectangular.

7. The method of claim 5, wherein an overall shaped formed by the plurality of masks in the mask layout is an irregular shape.

8. A method of forming patterned features on a substrate comprising:
    positioning a plurality of masks over a substrate based on a mask layout, wherein
        the substrate is positioned in a first plane and the plurality of masks are positioned in a second plane when the masks are positioned according to the mask layout, the plurality of masks in the mask layout have edges that each extend parallel to the first plane, each mask having a first edge, the substrate includes a plurality of areas configured to be patterned by energy directed through the masks arranged in the mask layout, the plurality of areas configured to be patterned are spaced apart from each other by one or more areas not configured to be patterned by the energy directed through the masks, and each area of the plurality of areas configured to be patterned is spaced apart from a closest area of the plurality of areas configured to be patterned by a shortest distance along a direction offset by at least 5 degrees from directions in the first plane that extend parallel, perpendicular, ±30 degrees, ±45 degrees, or ±60 degrees relative to the first edge of each mask of the plurality of masks in the second plane; and directing energy towards the plurality of areas through the plurality of masks when the masks are positioned over the substrate according to the mask layout, the directed energy forming a plurality of patterned features in each of the plurality of areas, wherein a number of the formed plurality of patterned features extending along directions in the first plane that are within ±2.5 degrees of being parallel, perpendicular, ±30 degrees, ±45 degrees, or ±60 degrees relative to the first edge of each mask of the plurality of masks in the second plane are greater than a number of the formed plurality of patterned features extending along directions in the first plane that do not align within ±2.5 degrees of being parallel, perpendicular, ±30 degrees, ±45 degrees, or ±60 degrees relative to the first edge of each mask of the plurality of masks in the second plane.

9. The method of claim 8, wherein the energy directed through the masks includes one or more of visible light or ultraviolet energy.

10. The method of claim 8, wherein two or more of the masks of the plurality of masks are simultaneously positioned over the substrate according to the mask layout.

11. The method of claim 8, wherein the plurality of masks includes three or more masks.

12. The method of claim 8, wherein each mask has a rectangular shape.

13. The method of claim 12, wherein an overall shaped formed by the plurality of masks in the mask layout is non-rectangular.

14. The method of claim 12, wherein an overall shaped formed by the plurality of masks in the mask layout is an irregular shape.

15. A method of forming gratings on a substrate comprising:

positioning a plurality of masks over a substrate based on a mask layout, wherein the substrate is positioned in a first plane and the plurality of masks are positioned in a second plane when the masks are positioned according to the mask layout, the plurality of masks in the mask layout have edges that each extend parallel to the first plane, each mask having a first edge, the substrate includes a plurality of areas configured to be patterned by energy directed through the masks arranged in the mask layout, the plurality of areas configured to be patterned are spaced apart from each other by one or more areas not configured to be patterned by the energy directed through the masks, and each area of the plurality of areas configured to be patterned is spaced apart from a closest area of the plurality of areas configured to be patterned by a shortest distance along a direction offset by at least 5 degrees from directions in the first plane that extend parallel or perpendicular to the first edge of each mask of the plurality of masks in the second plane; and directing energy towards the plurality of areas through the plurality of masks when the masks are positioned over the substrate according to the mask layout, the directed energy forming a plurality of gratings in each of the plurality of areas, wherein a number of the formed plurality of gratings extending along directions in the first plane that are within ±2.5 degrees of being parallel or perpendicular to the first edge of each mask of the plurality of masks in the second plane are greater than a number of the formed plurality of gratings extending along directions in the first plane that do not align within ±2.5 degrees of being parallel or perpendicular to the first edge of each mask of the plurality of masks in the second plane.

16. The method of claim 15, wherein the plurality of areas includes an input coupling region, an intermediate coupling region, and an output coupling region.

17. The method of claim 16, wherein the intermediate coupling region is a closest area to the input coupling region, and a shortest distance between the intermediate coupling region and the input coupling region extends along a first direction.

18. The method of claim 17, wherein the intermediate coupling region is a closest area to the output coupling region, and a shortest distance between the intermediate coupling region and the input coupling region extends along a second direction.

19. The method of claim 18, wherein the first direction is perpendicular to the second direction.

20. The method of claim 15, wherein two or more of the masks of the plurality of masks are simultaneously positioned over the substrate according to the mask layout.

* * * * *